United States Patent [19]

Hirano

[11] 4,104,083

[45] Aug. 1, 1978

[54] SOLAR BATTERY PACKAGE

[75] Inventor: Taizö Hirano, Tenri, Japan

[73] Assignee: Japanese Government, Japan

[21] Appl. No.: 784,775

[22] Filed: Apr. 5, 1977

[30] Foreign Application Priority Data

Apr. 23, 1976 [JP] Japan ............... 51-45353

[51] Int. Cl.² ............................................. H01L 31/04
[52] U.S. Cl. ............................ 136/89 H; 136/89 P; 156/60; 156/99
[58] Field of Search .............. 136/89 H, 89 P, 89 CC; 250/239

[56] References Cited

U.S. PATENT DOCUMENTS

| | | | |
|---|---|---|---|
| 3,769,091 | 10/1973 | Leinkram et al. | 136/89 |
| 3,957,537 | 5/1976 | Baskett et al. | 136/89 |
| 3,996,067 | 12/1976 | Broder | 136/89 |
| 4,001,863 | 1/1977 | Kobayashi et al. | 357/30 |
| 4,009,054 | 2/1977 | Gochermann et al. | 136/89 P |

*Primary Examiner*—Aaron Weisstuch

[57] ABSTRACT

A solar battery package having at least one solar cell substantially embedded in a block of fiber-reinforced thermosetting resin with a transparent flexible covering. The block has a portion, overlaying a light receiving area of the solar cell, which is transparent and has another portion which is either transparent or substantially opaque. A protective coating of fluorine-containing compound may be applied to the block to improve the weatherability of the solar battery package. A method of making the solar battery package is also disclosed.

8 Claims, 6 Drawing Figures

SOLAR BATTERY PACKAGE

BACKGROUND OF THE INVENTION

The present invention relates to a solar battery package and a method for making the same.

A solar battery package is known wherein one or a plurality of solar cells or photovoltaic cells each having a light receiving area on one surface thereof are hermetically sealed in a casing.

One conventional solar battery package which is well known in the prior art is shown in a sectional view in FIG. 1 of the accompanying drawings.

Referring first to FIG. 1, the solar cells, generally identified by 10 and, in the instance as shown, electrically connected in series with each other, are placed on a common substrate 11 in a predetermined pattern. The substrate 11 with the solar cells 10 thereon has a pair of lead wires 13 which extend outwards from the series-connected solar cells 10. The substrate 11 so constructed is mounted on a base support 15 by the use of a bonding agent 14 with the lead wires 13 inserted into and soldered to terminal pins 16 which are secured to and extend outwards from the base support 15. A transparent covering 17 is mounted on the base support 15 with its inside surface thereof spaced from the solar cells 10 on the substrate 11.

In the conventional solar battery package of the construction shown in FIG. 1, the casing constituted by the base support 15 and the transparent covering 17 is made of a synthetic resin such as acrylic resin or polycarbonate resin. When the casing is made of acrylic resin, it has been found that, because of insufficient physical strength of such resin, cracking is liable to occur during the outdoor use of the solar battery for a long period of time. Specifically, portions of the base support 15 where the terminal pins 16 are connected tend to be susceptible to cracking and, once this cracking occurs, a liquid medium, such as water, can penetrate into the space defined between the base support and the transparent covering. When this happens it causes a reduction in performance of the solar cells.

In addition, since the acrylic resin tends to deform in shape when heated to about 90° C or more, the solar battery or batteries packed in such a casing made of acrylic resin may not be used during the summer season, or in tropical areas, in which bright sunlight is likely to cause the casing to be heated to a temperature approximating or in excess of the temperature at which the acrylic resin starts to deform.

Moreover, because the method of making the solar battery package is complicated and the construction requires the use of manual labor, particularly in making various connections by the use of one or more kinds of bonding agents and, therefore, the solar battery package of the kind described above is not suited for mass production and, if production is not impossible, tends to become expensive.

In order to obviate the above described drawbacks resulting from the use of acrylic or polycarbonate resin as a material for the casing, and also to make it possible to manufacture solar battery packages on a mass production scale, I have tried to use, in place of the acrylic resin and the polycarbonate resin, a silicone resin and an epoxy resin which are known as a coating material for the conventional solar battery package. However, it has been found that the silicone resin, though it exhibits a relatively low water absorbability, tends to allow humidity to permeate therethrough and, therefore, the use of this silicone resin as a material for the battery casing may result in reduction in performance of the solar cells due to humidity permeating into the interior of the casing. Moreover, since the silicone resin when used alone has insufficient physical strength required to support the solar cells which are fragile, a casing made of the silicone resin requires the employment of an additional support or reinforcement in order to protect the solar cells. Furthermore, since the silicone resin tends to be easily electrostatically charged enough to attract dust particles floating in the air, the available output power of the solar battery package, if the casing is made of this silicone resin, tends to be less because substantially none of the light incident upon the casing reaches the light receiving areas of the solar cells in the presence of the dust particles electrostatically attracted on the casing.

Because of the foregoing reasons, silicone resin is not suited as a material for a battery casing which is used outdoors for a substantial period of time, particularly during the life time of the solar cells.

Shown in FIG. 2 is a solar battery package I have devised. Referring now to FIG. 2 the solar cells 10 are shown to be embedded in a transparent block 17 of silicone resin by the use of a molding technique, which block 17 is sandwiched between transparent glass plates 18 held flat against the upper and lower surfaces of the block 17. The assembly, composed of the block 17, having the solar cells 10 embedded therein, and the glass plates 18, is mounted on a frame 19 made of stainless steel and having a shape similar to the shape of the assembly. Between the inside surface of the frame 19 and the outer periphery of the assembly is a sealing material 20. However, I have found that the construction shown in FIG. 2 is complicated and requires a time-consuming labor in applying the sealing material and that the solar battery package shown in FIG. 2 is not suited for mass production.

In the construction shown in FIG. 2, the use of epoxy resin in place of the silicone resin has been tried. However, although epoxy resin has excellent physical properties as compared with silicone resin, it has been found that, due to water absorbability, the epoxy resin forming the block 17 tends to separate from the solar cells 10 during the use of the battery package for a long period of time and that epoxy resin when exposed to the sun, particularly to ultraviolet rays, for a long period of time tends to be easily colored so that the transparency is consequently reduced to such an extent that the available output voltage is reduced. Therefore, the use of epoxy resin as a material for the block 17 has been found to be unsatisfactory. Therefore, the solar battery package I have devised as shown in FIG. 2 does not constitute the subject matter of the present invention.

SUMMARY OF THE INVENTION

Accordingly, the present invention has been developed with the view of substantially eliminating the disadvantages and inconveniences inherent in the prior art solar battery packages and is intended to provide an improved solar battery package which utilizes a fiber-reinforced thermosetting plastic material as a material for the casing.

According to the present invention, there is disclosed an improved solar battery package comprising at least one solar cell formed on one surface of a thin wafer by the use of any known semiconductor manufacturing technique which ultimately serves as a light receiving area, said solar cell being hermetically wrapped by a thin transparent covering of synthetic resin which substantially completely encloses the solar cell therein except for a pair of lead wires extending outwardly from the solar cell. The assembly is embedded in a block of fiber-reinforced plastic material. The block has a portion which overlays the light receiving area of the solar cell embedded in the block which is transparent and also has another portion which is either transparent or opaque.

In order to improve the weatherability, the block having the solar cell embedded therein may have a transparent protective coating applied thereto over the entire surface thereof.

The fiber-reinforced thermosetting plastic which is employed as a material for the block can be unsaturated polyester or epoxy resin, each of which is reinforced with glass fibers. Since the fiber-reinforced plastic material has, as compared with a non-reinforced plastic material, excellent properties including physical strength, resistance to elevated temperature, hardness, resistance to cracking, thermal expansion coefficient, water absorbability, heat conductivity, electric insulating characteristic, and resistance to thermal shrinkage, it is suited as a package material for the solar battery.

The fiber-reinforced thermosetting plastic material which can be employed in the present invention is usualy opaque or semitransparent or in other words, has a low light transmissivity. However, present day plastic molding techniques can produce a transparent fiber-reinforced thermosetting resin and, in fact, such transparent fiber-reinforced thermosetting resin is currently used in the manufacture of corrugated roofing materials. By way of example, the transparent fiber-reinforced plastic can be prepared by mixing fibers of soda-lime glass with a substantially transparent thermosetting synthetic resin, preferably having a refractive index equal to that of the soda-lime glass. The amount of the glass fibers mixed with the transparent thermosetting synthetic resin is usually about 30% or more by weight relative to the total weight of the mixture. However, in order to retain a relatively high transparency, the employment of the glass fibers in an amount as small as possible is preferred.

Of the fiber-reinforced thermosetting plastics which may be employed in the practice of the present invention, glass fiber-reinforced polyester resin is preferred becasue of its excellent weatherability. More specifically, glass fiber-reinforced polyester resin has a high light transmissivity, a high softening point which is not less than 100° C, a high physical strength and a low water absorbability.

When the solar cell is embedded in a block which is made of the fiber-reinforced thermosetting plastic, the latter must be of a transparent nature having a high light transmissivity. Alternatively, when the block is composed of at least transparent and opaque layers, these two layers may be prepared from different kinds of fiber-reinforced thermosetting plastic in which case the fiber-reinforced thermosetting plastic having a high light transmissivity should be used as a material for one of these two layers which ultimately overlays the light receiving area of the solar cell.

However, in view of the fact that, in preparing the fiber-reinforced thermosetting resin, a thermosetting synthetic resin is, in addition to glass fibers included as a reinforcing material, mixed with various additives such as calcium carbonate or any other synthetic resin having a chemical affinity to the thermosetting synthetic resin in an attempt to improve the characteristics of the resultant fiber-reinforced thermosetting resin and/or to allow it to be marketed at a low price, the freedom of choice of such additives is limited so far as the transparent fiber-reinforced thermosetting plastic is involved. Therefore, in general, a fiber-reinforced thermosetting plastic having a high light transmissivity is more expensive than that having a low light transmissivity, that is, a substantially opaque or semitransparent fiber-reinforced thermosetting plastic. Accordingly, when the block is composed of the two layers it is preferred to employ a transparent fiber-reinforced thermosetting plastic for the layer which ultimately overlays the light receiving area of the solar cell in the block, and to employ an inexpensive, opaque or semitransparent fiber-reinforced thermosetting plastic for the opposite layer.

As hereinbefore described, the block of fiber-reinforced thermosetting plastic having the solar cell embedded therein can have applied thereto a protective coating of transparent synthetic resin. This is because, although the block satisfactorily serves the purpose of a protective coating as compared with the conventional solar battery package, it has been found that coloring of the transparent fiber-reinforced thermosetting plastic during continued exposure to outdoor conditions for more than a few years cannot be completely eliminated. The coloring of the fiber-reinforced thermosetting plastic results in reduction in light transmissivity thereof which in turn results in a reduction in the output voltage available from the solar battery. This disadvantage can be substantially eliminated by the employment of the transparent protective coating applied to all the surfaces of the block having the solar cell embedded therein.

The material for the protective coating can be a homopolymer of tetrafluoroethylene or hexafluoropropylene or a copolymer of tetrafluoroethylene and hexafluoropropylene (which copolymer is generally referred to as FEP). By way of example, a commercially available fluorine containing compound such as trademarked "Neoflon", manufactured and sold by Daikin Industries, Ltd., of Japan, "Sumiflunon" manufactured or sold by Sumitomo Chemical Industries, Ltd., of Japan and "FEP" manufactured and sold by Du Pont Co. of U.S.A. may be employed.

This fluorine-containing compound may be applied to all the surfaces of the block by any suitable method, for example, by the use of a brush applicator or a spray gun, the application being effected after the block with the solar cell therein has been completely cured or hardened.

BRIEF DESCRIPTION OF THE DRAWINGS

In any event, these and other objects and features of the present invention will become apparent from the following description taken in conjunction with preferred embodiments thereof with reference to the accompanying drawings, in which.

DETAILED DESCRIPTION OF THE INVENTION

Figure 1:
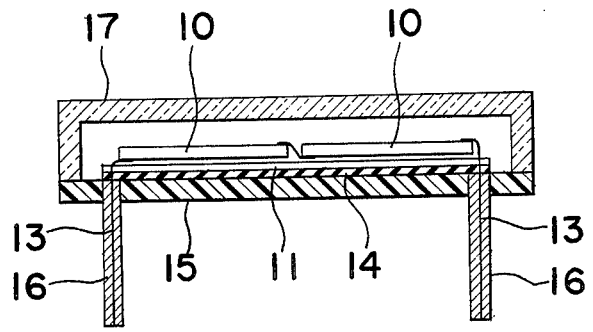
FIG. 1 is a sectional view of a prior art solar battery package, reference to which has already been made.

Before the description of the present invention proceeds, it is to be noted that like parts are designated by like reference numerals throughout the accompanying drawings.

Figure 3:
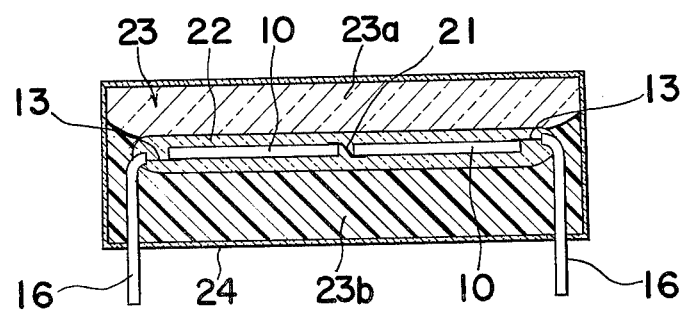
FIG. 3 is a sectional view of a solar battery package according to the present invention.
Figure 4:
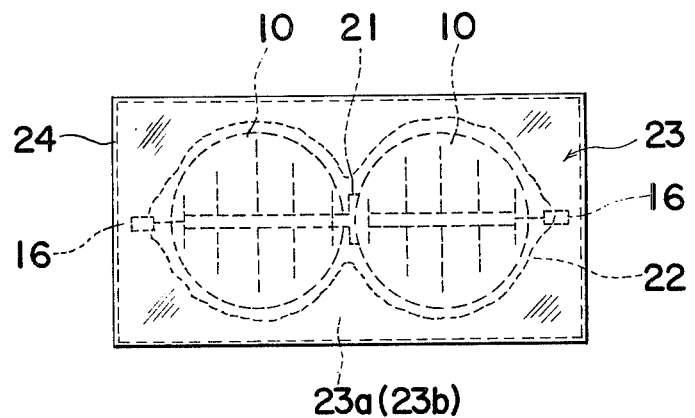
FIG. 4 is a top plan view of the solar battery package shown in FIG. 3.

Referring now to FIGS. 3 and 4, the solar cells 10, the number of which is shown to be two, are electrically connected in series with each other by means of an interconnecting member 21. The lead wires 13 extending outwards from the respective solar cells 10 are soldered, or connected in any other suitable manner, to the terminal pins 16. It is, however, to be noted that, depending upon the application and/or if the lead wires 13 have a sufficient length, the terminal pins 16 may not always be necessary.

The series connected solar cells 10 are hermetically wrapped by a transparent elastic covering 22, made of a material which will be described later, which is in turn embedded in a block 23 shown to be substantially composed of upper and lower layers 23a and 23b.

As hereinbefore described, the layers 23a and 23b may be made of the same kind of fiber-reinforced thermosetting plastic having a high light transmissivity, in which case the layers 23a and 23b constitute an integral block. Furthermore, in this case, any known injection or compression molding technique may be employed to form such an integral block with the solar cells 10 embedded therein. However, in the instance as shown, the upper layer 23a which overlays the light receiving areas of the respective solar cells 10 is shown to be made of a fiber-reinforced thermosetting resin, for example, fiber-reinforced unsaturated polyester resin, having a high light transmissivity, while the lower layer 23b is shown to be made of a fiber-reinforced unsaturated polyester resin of substantially opaque nature.

Because of the difference in light transmissivity between the layers 23a and 23b, the block 23 with the solar cells 10 therein can be manufactured by pouring the fiber-reinforced thermosetting resin of transparent nature into any suitable flask or container-like mold, then placing on the top level surface of the poured thermosetting resin the solar cells 10, which have been wrapped in the transparent covering 22, before the poured thermosetting resin of transparent nature is completely cured, and finally pouring the fiber-reinforced thermosetting resin of substantially opaque nature into the mold so as to completely enclose the wrapped solar cells 10, except for the outer end portions of the terminal pins 16 which are exposed on the outside of the block 23 for external electric connection, in cooperation with the thermosetting resin forming the layers 23a. Thereafter, the two kinds of fiber-reinforced thermosetting plastics of different nature which respectively form the layers 23a and 23b are allowed to cure to provide the complete block 23 with the solar cells 10 sandwiched, or substantially embedded, between the layers 23a and 23b.

During the manufacture of the block 23 with the solar cells 10 therein in the manner as hereinbefore described, internal stresses will be set up in the layers 23a and 23b as the latter undergo the curing process, which internal stresses will otherwise adversely affect the physical property of the solar cells 10. For example, the internal stresses set up in the layers 23a and 23b may constitute a cause cracking to occur in the solar cells 10. This can be avoided by the employment of the elastic covering 22 substantially hermetically sealing the solar cells 10 therein.

For forming the transparent elastic covering 22, a silicone resin is preferred because of its excellent weatherability, resistance to heat and elasticity. Of various kinds of silicone resin, an RTV silicone resin or an LTV silicone resin is more preferred. The most preferred is a two component LTV silicone adhesive consisting of a LTV silicone resin and a catalyst curing agent, because the resultant covering 22 formed by the use of such a two component LTV silicone adhesive as will be described later is hardly affected at all the influence of ultraviolet rays of sun light.

To form the transparent elastic covering 22, either a brushing method wherein a solution of silicone resin is brushed on by the use of a brush or a dipping method wherein the solar cells 10 are dipped into a bath containing a solution of silicone resin may be employed. Where the two component LTV silicone adhesive is employed as a material for the transparent elastic covering 22, the dipping method is preferred.

During the application of the silicone resin to form the transparent elastic covering 22, portions of the terminal pins 16 except for their ends adjacent the respective solar cells may be covered with lengths of adhesive tape to avoid unnecessary coating of the silicone resin on such portions of the terminal pins 16, which lengths of adhesive tape can be removed after the application of the silicone resin. When the terminal pins 16 are not employed, similar care should be given to the lead wires 13 so that a major portion of each of the lead wires 13 except for its end adjacent the solar cell 10 will not be coated with the silicone resin.

After the application of the silicone resin to the solar cells 10, the silicone coated solar cells 10 are subjected to a reduced pressure of about 1 mmHg for about 30 minutes to remove bubbles contained in the coating of the silicone resin, and then allowed to stand for about 1 hour at 150° C under a pressure equal to the atmosphere so that the coating of silicone resin is cured to form the transparent elastic covering 22.

In the manufacture of the solar battery package, prior to the first pouring of the fiber-reinforced thermosetting resin into the flask to form the layer 23a, a releasing agent may be applied to the interior surface of the flask to facilitate eventual removal of the block 23 from the flask. It is to be noted that, if some of the reinforcing fibers tend to concentrate at a local area in the layer 23a when the fiber-reinforced thermosetting resin in a liquid state is poured into the flask, an additional reinforcement, such as a glass cloth or glass strands, may be placed on the top level surface of the thermosetting resin within the flask which ultimately forms the transparent layer 23a.

After the pouring of the thermosetting resin into the flask the preparation of the transparent layer 23a, the solar cells 10 which have already been enclosed in the transparent elastic covering 22 are placed on the top level surface of the thermosetting resin within the flask with their light receiving areas oriented downwards, and the thermosetting resin within the flask is then allowed to substantially cure at 60° to 70° C for 10 to 20 minutes. It is to be noted that the holding of the thermosetting resin, which ultimately forms the layer 23a, at 60° to 70° C for 10 to 20 minutes does not result in complete curing of such thermosetting resin. After the solar cells 10 in the transparent elastic covering 22 have been placed on the thermosetting resin making up the layer 23a as hereinbefore described and before the thermosetting resin for the layer 23a is completely cured, the fiber-reinforced thermosetting resin in a liquid state is poured into the flask to ultimately form the layer 23b.

Subsequent to the pouring of the thermosetting resin for the layer 23b, pressure is applied to the top level surface of the thermosetting resin of layer 23b to smooth the surface thereof and also to allow bubbles in the thermosetting resin of layer 23b to be removed therefrom. This application of pressure may be by the use of, for example, a roll. However, it is to be noted that, for reasons similar to those hereinbefore described, an additional reinforcement, such as glass cloth or glass strands, may be placed on the thermosetting resin of layer 23b prior to the application of pressure.

After the application of the pressure to thermosetting resin for the layer 23b, the assembly within the flask is allowed to completely cure at 80° to 120° C for 30 to 60 minutes and, thereafter, is removed from the flask to provide the block 23 with the solar cells 10 substantially embedded therein.

When the layers 23a and 23b of the thermosetting resin block 23 are transparent and substantially opaque, respectively, there is the possibility that the thermosetting resins for the respective layers 23a and 23b will become mixed at the joint therebetween. However, the effect of this mixing can be neglected if the portion of the layer 23a overlaying the light receiving areas of the solar cells 10 retains its transparency. In the present invention, since the pouring of the thermosetting resin for the layer 23b is effected before the thermosetting resin for the layer 23a is completely cured, the above described possibility is reduced.

It is to be noted that the curing of the fiber-reinforced thermosetting resins for the layers 23a and 23b may also be effected at an ambient temperature under a pressure higher than or equal to the atmospheric pressure if desired. In any event, such parameters as are necessary to allow the thermosetting resins of the respective layers 23a and 23b to cure can be suitably selected as desired.

All of the surfaces of the block 23 with the solar cells 10 substantially embedded therein in the transparent elastic covering 22 are, after having been removed from the flask, coated with a protective coating 24 of a flourine containing compound such as a homopolymer of tetrafluoroethylene or a hexafluoropropylene or a copolymer of these synthetic resins. It is, however, to be noted that, depending upon the end use of the solar battery package according to the present invention, the application of the fluorine containing compound may be only to a surface portion of the block 23 immediately above the light receiving areas of the solar cells 10 in the block 23.

As is well known to those skilled in the art the voltage available from a single solar cell is limited and, therefore, a plurality of series-connected solar cells is used in practice to provide a high voltage. In view of this, to make possible the connection of a plurality of the solar battery packages of the present invention, the solar battery packages of the present invention can be shaped and physically connected in the manner as shown in FIGS. 5 and 6.

Figure 5:
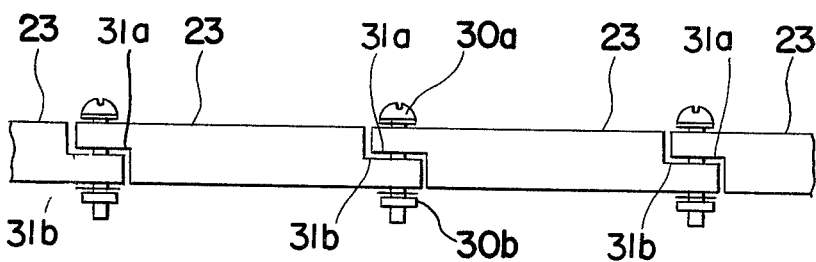
FIG. 5 is a side elevational view showing a plurality of solar battery packages according to the present invention interconnected to each other.
Figure 6:
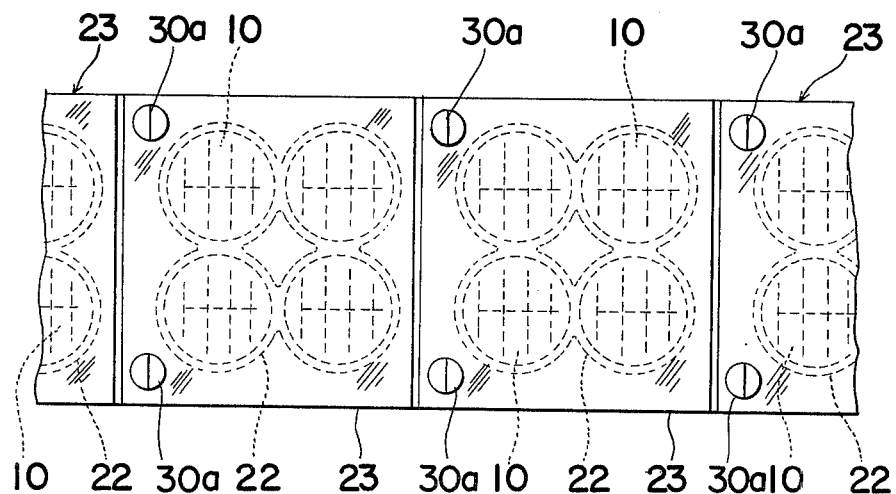
FIG. 6 is a top plan view of the assembly shown in FIG. 5.

Referring now to FIGS. 5 and 6, there is shown a plurality of solar battery packages connected by the use of connecting members in a manner which will be described later, each of the solar battery packages being shown as having four solar cells 10 embedded in the block 23 of the fiber-reinforced thermosetting resin. It is to be noted that the blocks 23 shown in FIGS. 5 and 6 and having the solar cells 10 enclosed in the transparent elastic coverings 22 have the same construction as shown in FIGS. 3 and 4 except for the difference in the number of the solar cells 10.

Each of the connecting members referred to above comprises a bolt 30a and a nut 30b and, for connecting the blocks 23 in the manner as shown, that is, in such a manner that the surfaces of the respective blocks 23 immediately above the light receiving areas of the solar cells 10 are held flush with each other, L-shaped cutout portions are formed at 31a and 31b in asymmetrical relation to each other along the opposite end edges of each of the blocks 23. These cutout portions 31a and 31b can be provided either during the molding of each of the blocks 23 or by machining each of the blocks 23 after the molding thereof.

It is to be noted that each of the blocks 23 may have four cutout portions along all four edges thereof so that the solar battery packages according to the present invention can be assembled into a panel of solar battery packages wherein the solar battery packages are aligned not only in one direction, but also in another direction perpendicular to the first mentioned direction.

For connection of the solar battery packages after a first solar battery package is positioned adjacent a second solar battery package with the cutout portion 31a or 31b of said first solar battery package engaged with the mating cutout portion 31b or 31a of said second solar battery package, the bolts 30a are inserted through the overlapping portions and are fastened with the associated nuts 30b.

Figure 2:
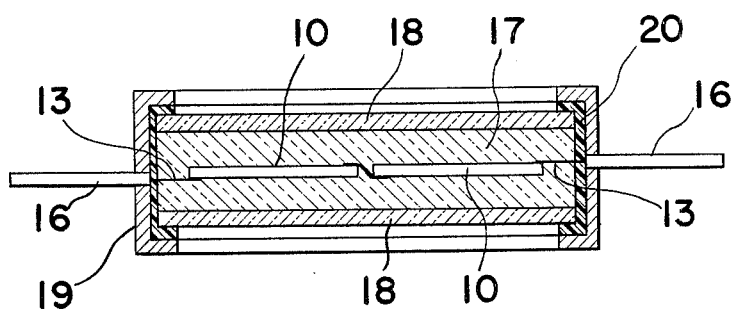
FIG. 2 is a view similar to FIG. 1, showing a solar battery package I have devised, but which does not constitute the subject matter of the present invention.

The present invention having fully been described, it will be appreciated that the solar battery package according to the present invention can readily be manufactured on a mass production scale since no frame member for the support of the solar battery package such as is required in the construction shown in FIGS. 1 and 2, is required. Moreover, the employment of the fiber-reinforced thermosetting resin as a material for the block 23 provides a physical strength comparable with that of a metallic material.

Although the present invention has fully been described in connection with the preferred embodiments thereof, it is to be noted that various changes and modifications will be apparent to those skilled in the art without departing from the true scope thereof. By way of example, the protective coating 24 may be made of a fluoride compound. Moreover, whenever the protective coating is made of a fluorine-containing compound or a fluoride compound, it may be formed by applying a film over the surface of the block. Accordingly, such changes and modifications, unless they depart from the true scope of the present invention, are to be understood as included therein.

What I claim is:

1. A solar battery package which comprises:
   a solar cell having a pair of lead wires extending therefrom and a light receiving area defined on one surface thereof; and a block of fiber-reinforced thermosetting synthetic resin, said solar cell being embedded in said block with the free ends of said lead wires extending outwardly of said block, at least the portion of said block which overlays the light receiving area of the solar cell being transparent, said block having four right-angled corners, at least two opposite sides of said block having respective cutout portions therein in asymmetrical relation to each other for connection of said solar battery package with another similarly shaped solar battery package.

2. A solar battery package as claimed in claim 1 wherein said cutout portions extend the full length of the respective opposite sides of said block, one being on one face of the block and the other being on the other face of the block.

3. A solar battery package as claimed in claim 1, wherein said block is comprised of two layers of fiber-reinforced thermosetting synthetic resin bonded to each other, said solar cell being positioned between said two layers, said transparent portion of the block being constituted by one of said two layers.

4. A solar battery package as claimed in claim 1, further comprising a transparent elastic covering hermetically enclosing the solar cell therein, said solar cell being embedded in said block together with said transparent elastic covering.

5. A solar battery package as claimed in claim 4, wherein said transparent elastic covering is made of silicone resin.

6. A solar battery package as claimed in claim 5, further comprising a protective coating of fluorine-containing compound applied to an outer surface of the block.

7. A solar battery package as claimed in claim 4, further comprising a protective coating of fluorine-containing compound applied to an outer surface of the block.

8. A solar battery package as claimed in claim 1, further comprising a protective coating of fluorine-containing compound applied to an outer surface of the block.

* * * * *